United States Patent
Miyoshi

(10) Patent No.: US 9,502,599 B2
(45) Date of Patent: Nov. 22, 2016

(54) SEMICONDUCTOR DEVICE, SOLID-STATE IMAGING DEVICE, AND ELECTRIC APPARATUS

(75) Inventor: Yasufumi Miyoshi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 740 days.

(21) Appl. No.: 12/923,584

(22) Filed: Sep. 29, 2010

(65) Prior Publication Data

US 2011/0018083 A1 Jan. 27, 2011

Related U.S. Application Data

(62) Division of application No. 12/222,855, filed on Aug. 18, 2008.

(30) Foreign Application Priority Data

Aug. 29, 2007 (JP) .................................. 2007-223114

(51) Int. Cl.
| | | |
|---|---|---|
| *H01L 31/0232* | (2014.01) | |
| *H01L 31/18* | (2006.01) | |
| *H01L 27/146* | (2006.01) | |

(52) U.S. Cl.
CPC .......... *H01L 31/18* (2013.01); *H01L 27/1463* (2013.01); *H01L 27/14687* (2013.01)

(58) Field of Classification Search
USPC ......... 257/414, 431, 432, 461, 465, E27.152
See application file for complete search history.

(56) References Cited

U.S. PATENT DOCUMENTS

| | | | | | |
|---|---|---|---|---|---|
| 5,343,060 | A | * | 8/1994 | Abe | ............................... 257/229 |
| 5,471,246 | A | * | 11/1995 | Nishima et al. | .............. 348/322 |
| 5,736,756 | A | * | 4/1998 | Wakayama et al. | .......... 257/223 |
| 5,986,704 | A | * | 11/1999 | Asai et al. | ..................... 348/340 |
| 2001/0042875 | A1 | * | 11/2001 | Yoshida | ........................ 257/291 |

FOREIGN PATENT DOCUMENTS

| | | |
|---|---|---|
| JP | 06-077179 A | 3/1994 |
| JP | 06-224403 A | 8/1994 |
| JP | 09-162137 | 6/1997 |
| JP | 2000-012830 A | 1/2000 |
| JP | 2006-303385 A | 11/2006 |

OTHER PUBLICATIONS

Japanese Office Action issued Sep. 25, 2012 for corresponding Japanese Application No. 2007-223114.

* cited by examiner

*Primary Examiner* — Daniel Whalen

(74) *Attorney, Agent, or Firm* — Michael Best & Friedrich LLP

(57) ABSTRACT

There is provided a method of producing a semiconductor device. The method includes the steps of: forming a first hard mask having an opening above a substrate; forming a sacrificial film above a side surface of the opening of the first hard mask; forming a second hard mask in the opening having the sacrificial film above the side surface; removing the sacrificial film after the second hard mask is formed; ion implanting a first conductivity-type impurity through the first hard mask; and ion implanting a second conductivity-type impurity through the first and second hard masks.

26 Claims, 9 Drawing Sheets

SEMICONDUCTOR DEVICE, SOLID-STATE IMAGING DEVICE, AND ELECTRIC APPARATUS

CROSS REFERENCES TO RELATED APPLICATIONS

This is a Divisional Application of the patent application Ser. No. 12/222,855, filed Aug. 18, 2008, which claims priority from Japanese Patent Application JP 2007-223114 filed in the Japanese Patent Office on Aug. 29, 2007, the entire contents of which being incorporated herein by reference.

BACKGROUND OF THE INVENTION

Field of the Invention

The present invention relates to a method of producing a semiconductor device, a solid-state imaging device, a method of producing an electric apparatus, and an electric apparatus.

Description of the Related Art

Isolation using an impurity diffusion layer is a technology of isolating a unit pixel in a solid-state imaging device such as a CCD imaging device. When an n-type photosensor including a photodiode forms a unit pixel, a lattice-shaped p-type impurity diffusion layer is formed as an element isolation region isolating unit pixels from one other. Such an element isolation region is formed by ion implantation between unit pixels through an ion implantation mask.

A unit pixel has been reduced in size in recent years. Accordingly, in order to increase a photosensor area for increasing an amount of light incident on each photosensor and increasing sensitivity of an imaging device, a deep and narrow element isolation region is demanded.

A certain amount of ion implantation energy may be necessary to ion implant an impurity between unit pixels and form a deep element isolation region. This increases an aspect ratio which may be necessary to form an opening in an ion implantation mask (hereinafter II mask). Currently, an II mask structure having a desired high aspect ratio may not be obtained using a photoresist as a mask material. Therefore, RIE (reactive ion etching) is typically used to form an II hard mask of $SiO_2$ having a desired structure.

FIGS. 1A to 1C are schematic process views of a method of producing a solid-state imaging device using an II hard mask in the related art. This example illustrates a schematic process of forming an element isolation region in a solid-state imaging device, where the element isolation region is formed by ion implantation.

First, as shown in FIG. 1A, an SiN film (hereinafter P—SiN film) 21 by plasma CVD (chemical vapor deposition), an $SiO_2$ film 22 and a resist mask 23 are formed on a surface of an Si substrate 20 with an n-type photosensor formed thereon, for example. Here, the photosensor formed on the Si substrate 20 is not shown. The P—SiN film 21 formed on the Si substrate 20 is used as a stopper layer, and the $SiO_2$ film 22 is used as an II hard mask. The $SiO_2$ film 22 forms an II hard mask having a high aspect ratio and thus has a thickness of 5 μm, for example. The resist mask 23 is formed as a pattern having a slit-like opening 25 formed by pattern exposure and development. Here, the opening 25 is formed to have a width of 0.5 μm, for example.

Next, as shown in FIG. 1B, the $SiO_2$ film 22 is etched through the opening 25 of the resist mask 23 to form an II hard mask 26 having a high aspect ratio.

Next, as shown in FIG. 1C, a p-type impurity, for example, is ion implanted into the Si substrate 20 through the II hard mask 26 having a high aspect ratio and thermally diffused to form an element isolation region 24. Since an impurity is ion implanted into the Si substrate 20 through the II hard mask 26 having a high aspect ratio, a narrow and deep p-type diffusion region may be formed as the element isolation region 24.

In addition to a demand for a pixel reduced in size, an element isolation region is also demanded to be narrow, and therefore an II hard mask opening is demanded to be as narrow as 0.3 μm or less. FIGS. 2A to 2C show a schematic configuration of a solid-state imaging device having an II hard mask having an aspect ratio of 20, for example. In FIGS. 2A to 2C, parts corresponding to those of FIG. 1 are indicated by the same symbols and repeated description thereof is omitted. In the case of forming the II hard mask 26 as shown in FIGS. 1A to 1C, it is difficult to vertically process the $SiO_2$ film by RIE when the aspect ratio reaches about 20. In this case, the II hard mask 26 may not have an ideal vertical shape as shown in FIG. 2A but has a tapered shape as shown in FIG. 2B or a bowing shape as shown in FIG. 2C. When the opening of the II hard mask 26 has a tapered or bowing shape, ion implantation is performed in accordance with a widest width of the opening shape. Therefore, distribution of an impurity diffusion layer is wider than a desired distribution indicated by a broken line as shown in FIG. 2B or 2C. Accordingly, in the solid-state imaging device, the element isolation region 24 becomes wider than the desired distribution region indicated by the broken line and narrows an adjacent photosensor region (not shown), so that sensitivity of the imaging device to incident light is decreased, disadvantageously.

Japanese Unexamined Patent Application Publication No. 9-162137 discloses an ion implantation method including reducing a size of an opening on a lower edge of the opening of a mask pattern by reflowing to control a minute area of an ion implantation region and then implanting ions in a desired position.

SUMMARY OF THE INVENTION

However, a mask pattern formed of a resist layer described in Japanese Unexamined Patent Application Publication No. 9-162137 has an opening width of 1 μm and a thickness of 1 to 2 μm and has a low aspect ratio. Accordingly, deep ion implantation may not be expected.

As described above, when a hard mask having a large thickness is used to perform deep ion implantation, it is difficult to accurately form a mask pattern having a smaller opening width, and therefore desirable ion implantation into a narrow region may not be achieved, disadvantageously.

In view of the aforementioned points, it is desirable to provide a method of producing a semiconductor device including a narrow and deep impurity region and a solid-state imaging device including the same. Further, it is desirable to provide a method of producing an electric apparatus including a narrow and deep impurity region and an electric apparatus including the same.

According to an embodiment of the present invention, there are provided a method of producing a semiconductor device and a method of producing an electric apparatus. Each of the methods includes the steps of: forming a first hard mask having an opening above a substrate; forming a sacrificial film above a side surface of the opening of the first hard mask; forming a second hard mask in the opening having the sacrificial film above the side surface; removing the sacrificial film after the second hard mask is formed; ion implanting a first conductivity-type impurity through the first hard mask; and ion implanting a second conductivity-type impurity through the first and second hard masks.

In a method of producing a semiconductor device and a method of producing an electric apparatus according to an embodiment of the present invention, a sacrificial film is formed above a side surface of an opening of a first hard mask, a second hard mask is formed and then the sacrificial film is removed, so that the second hard mask may be formed by self-alignment.

According to an embodiment of the present invention, there are provided a solid-state imaging device and an electric apparatus, each including a unit pixel having a second conductivity-type photosensor and a first conductivity-type element isolation region having both edges covered by a second conductivity-type impurity and isolating the unit pixel.

In a solid-state imaging device and an electric apparatus according to an embodiment of the present invention, both edges of a first conductivity-type element isolation region are covered by a second conductivity-type impurity, so that the element isolation region may not become widened and accordingly a photosensor is not narrowed.

In a method of producing a semiconductor device and a method of producing an electric apparatus according to an embodiment of the present invention, first and second hard masks are used, so that an impurity region is narrowed and a deep impurity region is formed, in the case of using a mask having a high aspect ratio.

In a solid-state imaging device and an electric apparatus according to an embodiment of the present invention, both edges of a first conductivity-type element isolation region are covered by a second conductivity-type impurity, so that the element isolation region is finally formed as a deep and narrow region and it is possible to suppress a decrease in sensitivity due to reduction of a photosensor in size.

DESCRIPTION OF THE PREFERRED EMBODIMENTS

Embodiments of the present invention will be described below with reference to the drawings.

FIGS. 3A to 3D show schematic process in a method of producing a semiconductor device according to a first embodiment of the present invention. The present embodiment is an example where a p-type impurity region is formed by ion implantation in a semiconductor device.

Figure 1A:
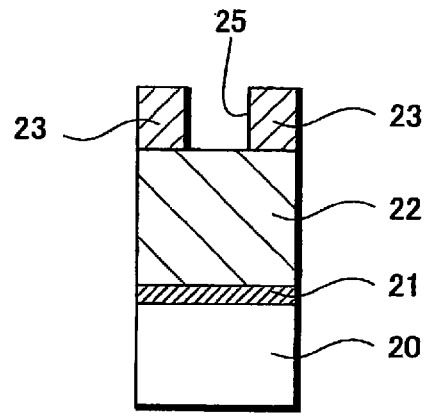
FIGS. 1A to 1C are schematic process views of a method of forming an element isolation region in a solid-state imaging device of the related art.
Figure 1B:
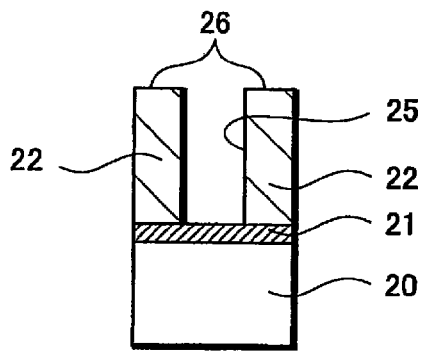
Figure 1C:
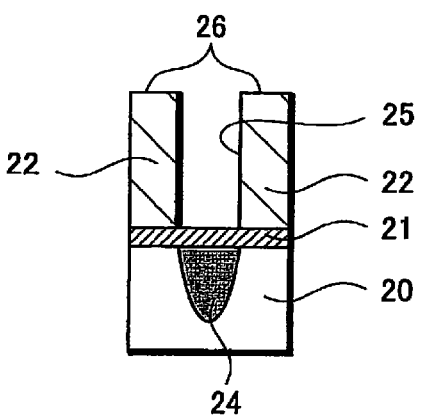
Figure 2A:
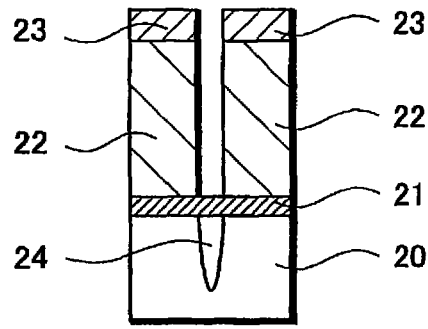
FIG. 2A shows an example of an ideal shape of an element isolation region when using an II hard mask having an opening with a high aspect ratio in a solid-state imaging device.
Figure 2B:
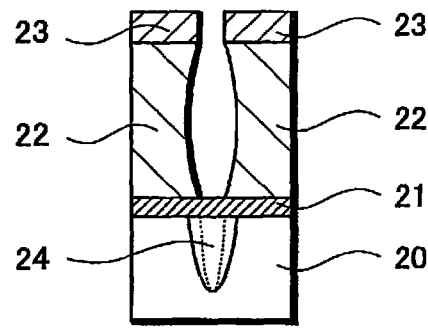
FIGS. 2B and 2C show an example of a defective shape of the element isolation region.
Figure 2C:
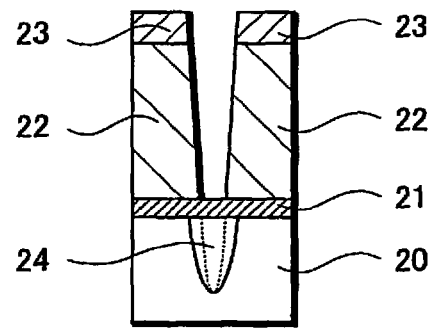
Figure 3A:
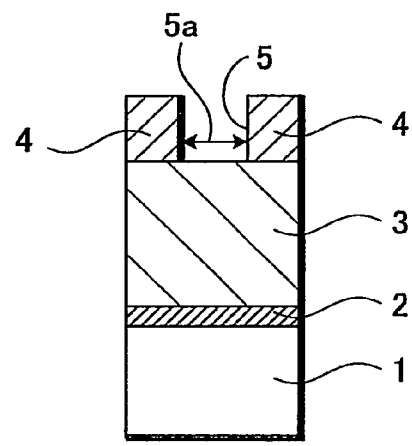
FIGS. 3A to 3D are schematic process views (1) showing a method of producing a semiconductor device according to a first embodiment of the present invention.

First, as shown in FIG. 3A, a P—SiN film 2, an $SiO_2$ film 3 and a resist mask 4 are formed on a surface of a substrate 1 formed of Si or the like. The P—SiN film 2 is used as a stopper layer, and the $SiO_2$ film 3 is used as a hard mask. The P—SiN film 2 is formed to have a thickness of about 0.3 μm. The $SiO_2$ film 3 forms a hard mask having a high aspect ratio and is therefore formed to have a thickness of 5 μm, for example. The resist mask 4 is formed as a pattern having a slit-like opening 5 by pattern exposure and development. Here, an opening width (hereinafter gap length 5a) of 0.5 μm is formed, for example. The gap length 5a is formed wider than a width of an impurity region intended to be finally formed in the present embodiment.

Figure 3B:
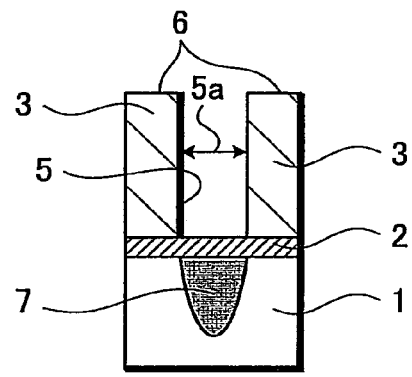

Next, as shown in FIG. 3B, the $SiO_2$ film 3 is etched through the opening 5 of the resist mask 4 to form a first hard mask 6 having an aspect ratio of about 10. Since the gap length 5a is wider than the desired width of the impurity region, the opening 5 in the first hard mask 6 has an aspect ratio lower than a desired aspect ratio. After forming the first hard mask 6 by etching, the resist mask 4 is removed by ashing. In the present embodiment, the resist mask 4 is removed. However, it is possible to perform a next step without removing the resist mask 4.

Then, a first conductivity-type p-type impurity is ion implanted into the substrate 1 through the first hard mask 6, for example, to form a first conductivity-type impurity region 7.

Figure 3C:
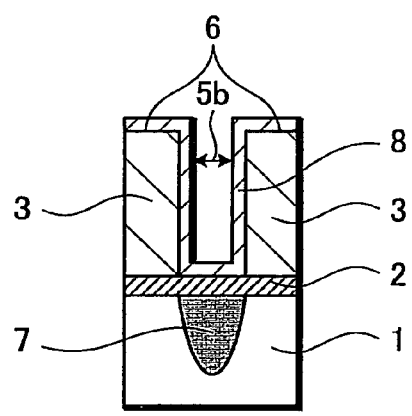

One example of ion implantation conditions in the present embodiment is shown below.
<Apparatus Used>
Ion beam source
<Conditions>
Dopant: boron
Acceleration voltage: 2.5 MeV Next, as shown in FIG. 3C, a sacrificial film 8 is deposited in order to reduce the gap length 5a of the first hard mask 6. A shrinking agent used as a material for the sacrificial film 8 may be a material having excellent releasability and a high selective etching rate to a material of the first hard mask 6 during release and having an excellent coverage on a side wall of the first hard mask 6, that is, having an excellent side wall coverage. For example, the shrinking agent may be polyethylene or a polymer containing fluorocarbon ($C_xF_y$) deposited by PVD (physical vapor deposition) or CVD using gas of $C_xH_y$ such as $CH_4$ or $C_2H_4$ as raw material gas. Specific examples of the shrinking agent include CFx (plasma CVD film, Tokyo Electron Ltd.). It is also possible to use a shrinking agent deposited as one layer along an opening pattern by coating. A sacrificial film having a uniform thickness along an opening pattern may be deposited by CVD or PVD.

In the present embodiment, a fluorocarbon polymer easily releasable is used as the sacrificial film 8 and is deposited to have a thickness of 100 nm on the side wall of the first hard mask 6 in an inductively coupled plasma apparatus.

One example of deposition conditions in the present embodiment is shown below.

Figure 3D:
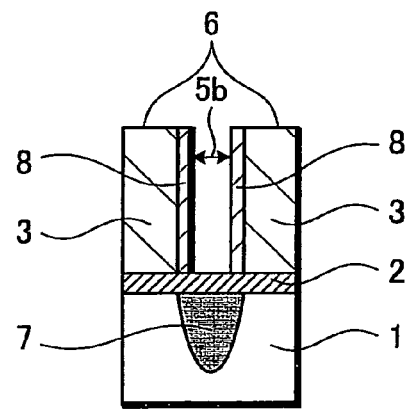

<Apparatus Used>
Inductively coupled plasma apparatus
<Conditions>
Pressure: 50 mTorr
Gas used and flow rate: $C_5F_8/Ar=10/500$ sccm
Power: 1000 W
Deposition time: 60 s Thereafter, as shown in FIG. 3D, the sacrificial film 8 is deposited only on the side wall of the first hard mask 6 by etching back. The first hard mask 6 has a gap length 5b of about 300 nm.

Figure 4E:
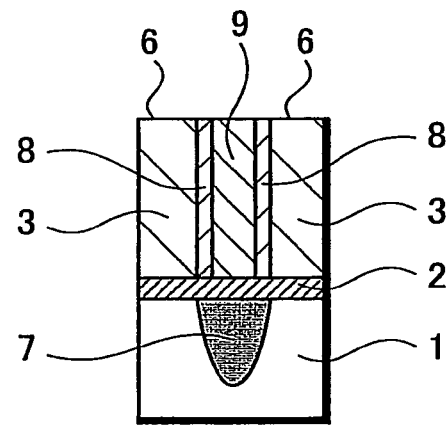
FIGS. 4E to 4G are schematic process views (2) showing a method of producing a semiconductor device according to a first embodiment of the present invention.

Subsequently, as shown in FIG. 4E, a material layer such as an SOG (spin-on-glass) oxide film is deposited in a reduced gap (300 nm) of the first hard mask 6, and then a second hard mask 9 is formed by etching back. A material for the second hard mask 9 is preferably a material having high etching resistance during release of the sacrificial film 8 and excellent embeddability. Examples of the material include metal-containing siloxy acid such as TiO, in addition to the aforementioned SOG oxide film. The second hard mark 9 formed of such a material is deposited by CVD or SOG.

In the present embodiment, an SOG oxide film having excellent embeddability is deposited as the second hard mask 9 by embedding coating.

One example of deposition conditions in the present embodiment is shown below.

Figure 4F:
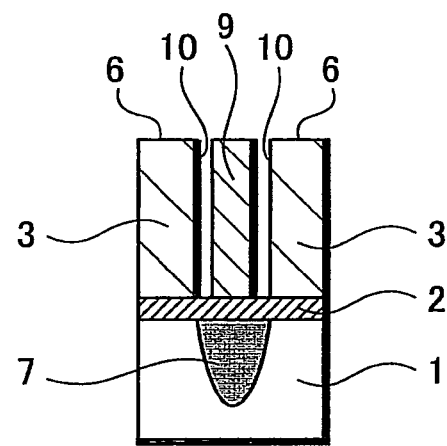

<Apparatus Used>
Spin coater
<Conditions>
Number of revolutions: 1500 rpm
Treatment time: 10 s Then, as shown in FIG. 4F, the sacrificial film 8 formed in a step shown in FIG. 4E is removed by plasma ashing or the like.

One example of ashing conditions in the present embodiment is shown below.

<Apparatus Used>
Inductively coupled ashing
<Conditions>
Pressure: 20 mTorr
Gas used and flow rate: $N_2/O_2=400/50$ sec
ICP power: 700 W
Treatment time: 300 s The sacrificial film 8 is removed to form the second hard mask 9 by self-alignment. The second hard mask 9 is formed so that a new opening 10 is formed between the first hard mask 6 and the second hard mask 9. That is, the first and second hard masks 6 and 9 form a self-aligned II hard mask having an opening on an edge of the first conductivity-type impurity region 7.

Figure 4G:
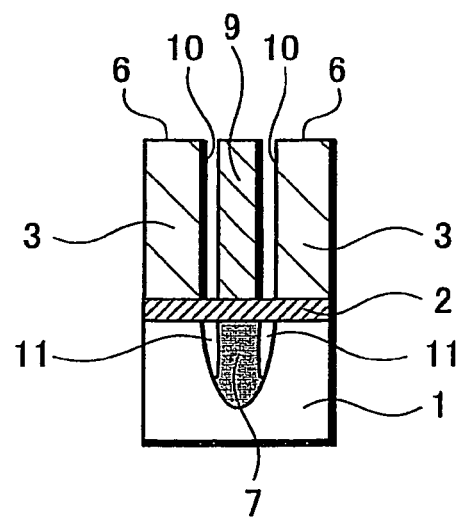

Then, as shown in FIG. 4G, a second conductivity-type impurity such as an n-type impurity is ion implanted using the first and second hard masks 6 and 9 forming the opening 10 exposing the edge of the p-type impurity region.

One example of ion implantation conditions in the present embodiment is shown below.

<Apparatus Used>
Ion beam source
<Conditions>
Dopant: phosphorus
Acceleration voltage: 3.0 MeV The first and second hard masks 6 and 9 are used as described above to form a compensation region 11 where each edge of the first conductivity-type impurity region 7 is covered by the second conductivity-type impurity. The compensation region 11 is formed of the second conductivity-type impurity such as the n-type impurity, so that the p-type first conductivity-type impurity region 7 is narrowed and the desired narrow and deep first conductivity-type impurity region 7 is formed.

According to the present embodiment, a thickness of a hard mask may be sufficiently ensured, making it possible to perform deeper ion implantation.

In a first hard mask, an opening is formed having an aspect ratio lower than a high aspect ratio originally necessary for an opening, making it possible to prevent a defective opening shape caused by formation of an opening pattern having a high aspect ratio and to stably form an impurity region. Further, a second hard mask may be formed by self-alignment and a compensation dopant may be implanted from an opening 10 formed by the first and second hard masks. Therefore, an edge of an impurity region formed of the first hard mask is covered and a narrow impurity region may be formed.

Next, FIGS. 5A to 6F show a schematic process in a method of producing a semiconductor device according to a second embodiment of the present invention.

As in the first embodiment, the present embodiment is an example where an impurity region in a semiconductor device is formed by ion implantation.

Figure 5A:
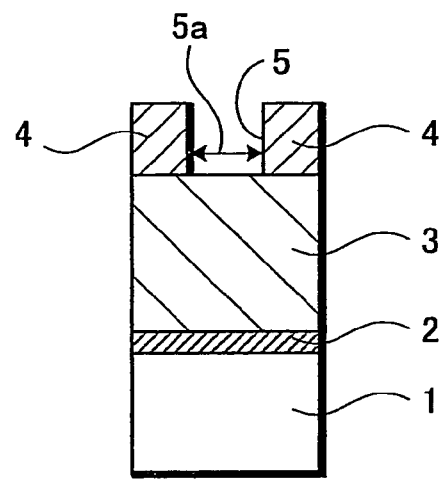
FIGS. 5A to 5C are schematic process views (1) showing a method of producing a semiconductor device according to a second embodiment of the present invention.

First, as shown in FIG. 5A, a P—SiN film 2, an $SiO_2$ film 3 and a resist mask 4 are formed on a surface of a substrate 1 formed of Si or the like. The P—SiN film 2 is used as a stopper layer, and the $SiO_2$ film 3 is used as a hard mask. The P—SiN film 2 is formed to have a thickness of about 0.3 μm. The $SiO_2$ film 3 forms a hard mask having a high aspect ratio and is therefore formed to have a thickness of 5 μm, for example. In the resist mask 4, a resist mask pattern having a slit-like opening 5 is formed by exposure. Here, an opening width (hereinafter gap length 5a) of 0.5 μm is formed, for example. The gap length 5a is formed wider than a width of an impurity region intended to be finally formed in the present embodiment.

Figure 5B:
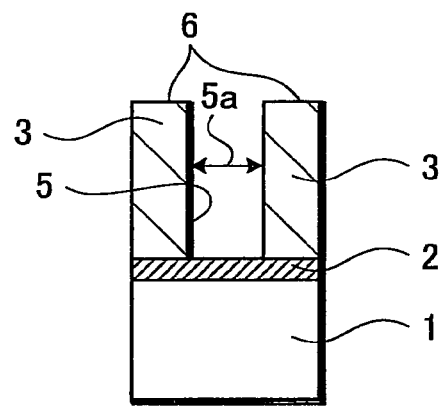

Next, as shown in FIG. 5B, the $SiO_2$ film 3 is etched through the resist mask 4 to form a first hard mask 6 having the opening 5 with an aspect ratio of about 10. Since the gap length 5a is wider than the desired width of the impurity region, the opening 5 in the first hard mask 6 has an aspect ratio lower than a desired aspect ratio. After forming the first hard mask 6 by etching, the resist mask 4 is removed by ashing or the like. In the present embodiment, the resist mask 4 is removed. However, it is possible to perform a next step without removing the resist mask 4.

Figure 5C:
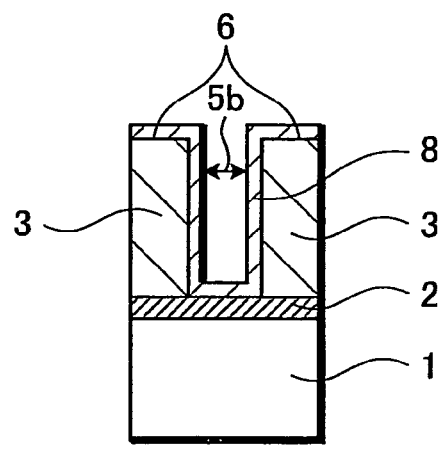

Next, as shown in FIG. 5C, a sacrificial film 8 is deposited in order to reduce the gap length 5a of the first hard mask 6. As in the first embodiment, a shrinking agent used as a material for the sacrificial film 8 may be a material having excellent releasability and a high selective etching rate to a material of the first hard mask 6 during release and having an excellent coverage on a side wall of the first hard mask 6, that is, having an excellent side wall coverage. For example, the shrinking agent may be a polyethylene polymer deposited by PVD or CVD using gas of $C_xH_y$ such as $CH_4$ or $C_2H_4$ as raw material gas. It is also possible to use a shrinking agent deposited as one layer along an opening pattern by coating. Specific examples of the shrinking agent include CFx (plasma CVD film, Tokyo Electron Ltd.).

In the present embodiment, a fluorocarbon polymer easily releasable is deposited to have a thickness of 100 nm on the side wall of the first hard mask 6 in an inductively coupled plasma apparatus.

Figure 6D:
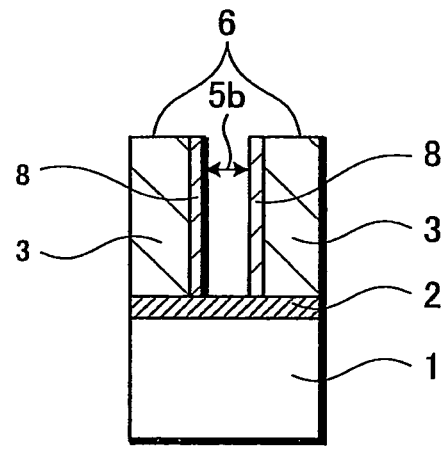
FIGS. 6D to 6F are schematic process views (2) showing a method of producing a semiconductor device according to a second embodiment of the present invention.

One example of deposition conditions in the present embodiment is shown below.
<Apparatus Used>
Inductively coupled plasma apparatus
<Conditions>
Pressure: 50 mTorr
Gas used and flow rate: $C_5F_8/Ar=10/500$ sccm
Power: 1000 W
Deposition time: 60 s Thereafter, as shown in FIG. 6D, the sacrificial film 8 is deposited only on the side wall of the first hard mask 6 by etching back. The first hard mask 6 has a gap length 5b of 300 nm.

Figure 6E:
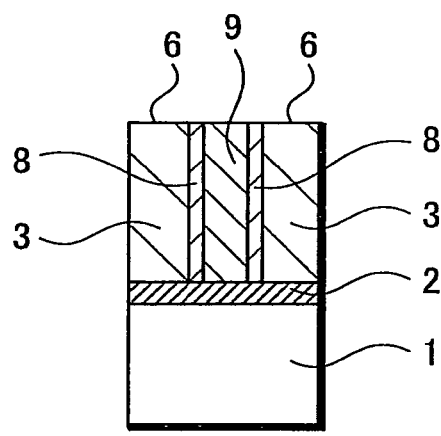

Subsequently, as shown in FIG. 6E, a material such as TiN is deposited in a reduced gap with the length 5b (300 nm) of the first hard mask 6, and a second hard mask 9 is formed by etching back. A material for the second hard mask 9 is preferably a material having high etching resistance during release of the sacrificial film 8, excellent embeddability and high adhesion to an insulating film. Examples of the material include metal-containing siloxy acid such as TiO, in addition to the aforementioned TiN. The second hard mark 9 formed of such a material as TiN or metal-containing siloxy acid like TiO is deposited by CVD or SOG.

In the present embodiment, the second hard mask 9 is deposited using a material differing in material characteristics from the first hard mask 6. That is, the second hard mask 9 is deposited using a material having a high selective etching rate to a material such as $SiO_2$ forming the first hard mask when the second hard mask 9 is removed using a chemical as later described.

In the present embodiment, TiN differing in material characteristics from $SiO_2$ used for the first hard mask 6 is deposited by embedding coating.

Figure 6F:
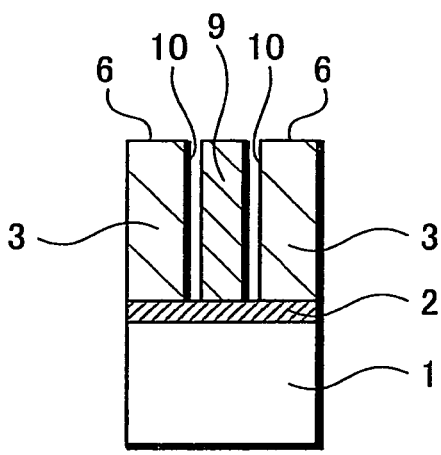

One example of deposition conditions in the present embodiment is shown below.
<Apparatus Used>
Sputtering deposition apparatus
<Conditions>
Target: TiN
Pressure: 5 mTorr
Gas used and flow rate: $Ar/N_2=30/80$ sccm
DC: 8 kW
Temperature: 150° C.
Deposition time: 10 min Then, as shown in FIG. 6F, the sacrificial film 8 formed in a step shown in FIG. 6E is removed by plasma ashing, for example.

One example of ashing conditions in the present embodiment is shown below.
<Apparatus Used>
Inductively coupled ashing apparatus
<Conditions>
Pressure: 20 mTorr
Gas used and flow rate: $N_2/O_2=400/50$ sec
ICP power: 700 W
Treatment time: 300 s The sacrificial film 8 is removed, so that the second hard mask 9 is formed by self-alignment and an opening 10 is formed between the first hard mask 6 and the second hard mask 9.

Figure 7G:
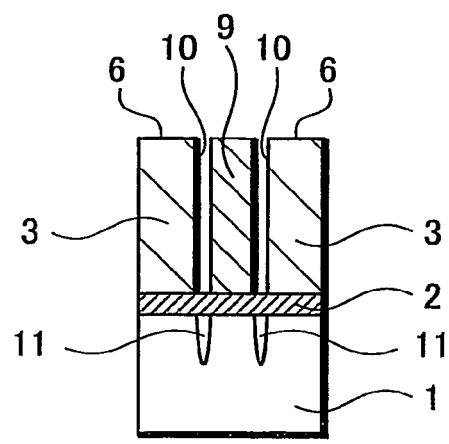
FIGS. 7G to 7I are schematic process views (3) showing a method of producing a semiconductor device according to a second embodiment of the present invention.

Subsequently, as shown in FIG. 7G, a second conductivity-type impurity for compensation is ion implanted as a dopant through the opening 10 formed by the first and second hard masks 6 and 9. In the present embodiment, a first conductivity-type impurity is a p-type impurity, and phosphorus is used as the n-type impurity for compensation, for example.

One example of ion implantation conditions in the present embodiment is shown below.
<Apparatus Used>
Ion beam source
<Conditions>
Dopant: phosphorus
Acceleration voltage: 3.0 MeV In this manner, a compensation region 11 is previously formed in a substrate 1 at a position corresponding to the opening 10 formed by the first and second hard masks 6 and 9.

Figure 7H:
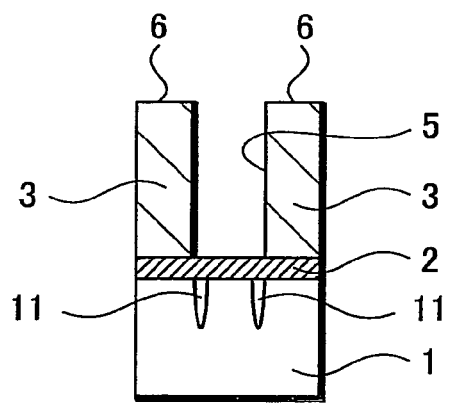

Next, as shown in FIG. 7H, the second hard mask 9 is removed by a chemical. The chemical used only removes the second hard mask 9 and does not remove the first hard mask 6.

Figure 7I:
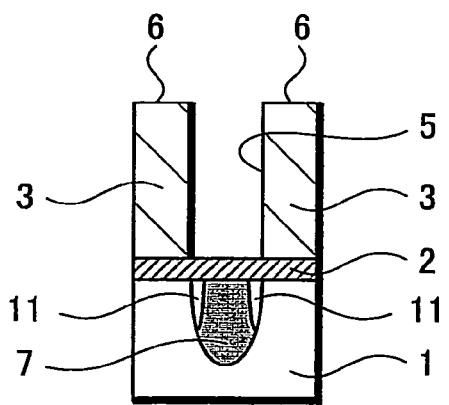

A chemical removal condition in the present embodiment is shown below.
<Chemical Used>
$H_2O=50$ ml, $HCl_{(1.19)}=50$ ml Then, as shown in FIG. 7I, the first conductivity-type impurity such as the p-type impurity is ion implanted as a dopant through the opening 5 having a gap length widened again in the first hard mask 6. Phosphorus is used as the p-type impurity, for example.

One example of ion implantation conditions in the present embodiment is shown below.
<Apparatus Used>
Ion beam source
<Conditions>
Dopant: boron
Acceleration voltage: 2.5 MeV The first conductivity-type impurity such as the p-type impurity is ion implanted from the opening 5 of the first hard mask, so that a region corresponding to the opening 5 in the substrate 1 is doped with the p-type impurity to form a first conductivity-type impurity region 7. Here, in the present embodiment, as shown in FIG. 7I, an edge of the first conductivity-type impurity region 7 doped with the first conductivity-type impurity such as the p-type impurity is previously doped with the second conductivity-type impurity such as the n-type impurity in the aforementioned step to form the compensation region 11. Therefore, the substantial first conductivity-type impurity region 7 is an area of the p-type impurity doped region other than both edges thereof. The desired narrow and deep first conductivity-type impurity region 7 may be formed in this manner.

According to the present embodiment, an impurity region is formed using a hard mask having an aspect ratio lower than that of a hard mask having a high aspect ratio which is used for forming an impurity region having a desired width and a desired depth. Then, a compensation region is formed on each edge of the impurity region using a self-aligned hard mask, so that a desired impurity region may be formed. Therefore, it is possible to prevent expansion of an impurity region due to a defective shape of a hard mask of the related art having a high aspect ratio and to stably form a narrow and deep impurity region.

In a related art method of forming an impurity region by ion implantation using a hard mask having a high aspect ratio, it is difficult to accurately form a desired impurity region when the impurity region is reduced in size.

According to the aforementioned first and second embodiments, since a compensation region is formed on an edge, a narrow and deep impurity region may be formed with accuracy when the impurity region is reduced further in size. It is assumed that accuracy in distribution of the compensation region has only a small influence on performance of the impurity region. That is, even if the compensation region is formed slightly wider, the impurity region may exhibit its performance sufficiently. Therefore, the compensation region may have a considerable effect of making the impurity region narrow.

A method of producing a semiconductor device where the narrow and deep impurity region of the present embodiment is formed may be applied when forming an element isolation region in a solid-state imaging device such as a CCD solid-state imaging device or CMOS image sensor, for example.

Figure 8:
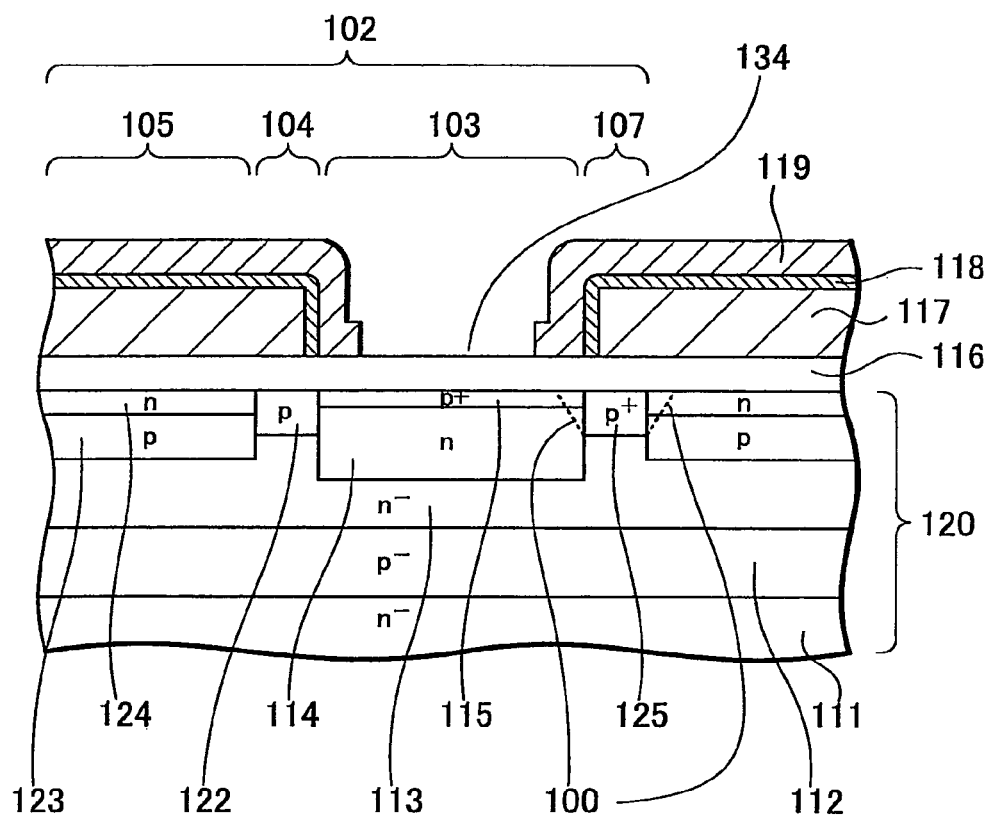
FIG. 8 is a schematic cross-sectional view of a solid-state imaging device according to a third embodiment of the present invention.

FIG. 8 shows a cross-sectional structure of a main part of a solid-state imaging device according to a third embodiment of the present invention. The present embodiment is an example where an element isolation region is formed in a CCD solid-state imaging device or the like, using the method of forming an impurity region according to the first or second embodiment.

A solid-state imaging device 101 of the present embodiment is a CCD solid-state imaging device having a photosensor 103 with an HAD (hole accumulated diode) structure. For example, a semiconductor substrate 120 formed of Si has a first p-type well region 112 formed on an n-type substrate 111. An n-type low impurity concentration region 113 is formed on the first p-type well region 112. Further, a photodiode 114 having a charge accumulation region ($p^+$ accumulation region) 115 formed on its surface is arranged in a vertical direction and a horizontal direction in matrix. Each pixel of the photosensor 103 is formed in this manner.

A second p-type well region 123 is formed at a necessary distance from the photosensor 103, that is, the photodiode 114 arranged on a common vertical line. An n-type charge transfer region (transfer channel region) 124 is formed on the second p-type well region 123 to form a vertical charge transfer part 105.

A p-type signal charge reading region 122 is formed between the vertical charge transfer part 105 and the corresponding photodiode 114 to form a reading part 104. An element isolation part 107 is formed by a p-type element isolation region 125 between adjacent different vertical transfer parts. A unit pixel 102 is formed by one photosensor 103, one reading part 104, one vertical charge transfer part 105 and one element isolation part 107.

A compensation region 100 is formed on an edge of the p-type element isolation region 125 according to the present embodiment. The element isolation region 125 is accurately formed as a narrow region and may not interfere with a region of the photodiode 114.

A light transmissive insulating film 116 is formed of $SiO_2$ or the like on a surface of the semiconductor substrate 120. A thermally resistant vertical transfer electrode 117 is formed of polycrystalline silicon on the insulating film 116 over the charge transfer region 124 and the reading region 122.

Further, a light shielding film 119 is formed on the whole surface of the vertical transfer electrode 117 through an insulating interlayer 118 of $SiO_2$ or the like.

An opening 134 is formed in the light shielding film 119 to expose the photosensor 103. Light is received by the photosensor 103 through the opening 134, and signal charges are generated in the photodiode 114 in accordance with an amount of light received.

In the CCD solid-state imaging device 101, signal charges are photoelectrically converted and accumulated in each photosensor 103, read to each corresponding vertical charge transfer part 105 through the reading part 104, transferred in the vertical charge transfer part 105 to a horizontal charge transfer part (not shown) for each horizontal line, further transferred in the horizontal charge transfer part in one direction, voltage-converted through an output circuit and output.

According to the solid-state imaging device 101 formed of CCD or the like of the present embodiment, the compensation region 100 is formed on an edge of the element isolation region 125 facing the photodiode 114, so that the element isolation region 125 is not widened, that is, a region of the photodiode 114 is not narrowed. With a pixel being reduced in size, the element isolation region 125 is also reduced in size. However, in the CCD solid-state imaging device 101 of the present embodiment, when the element isolation region is formed, the compensation region 100 is formed on an edge of the region, making it possible to accurately form the desired narrow and deep element isolation region 125. This suppresses a decrease in sensitivity due to reduction of the photosensor 103 in size.

Figure 9:
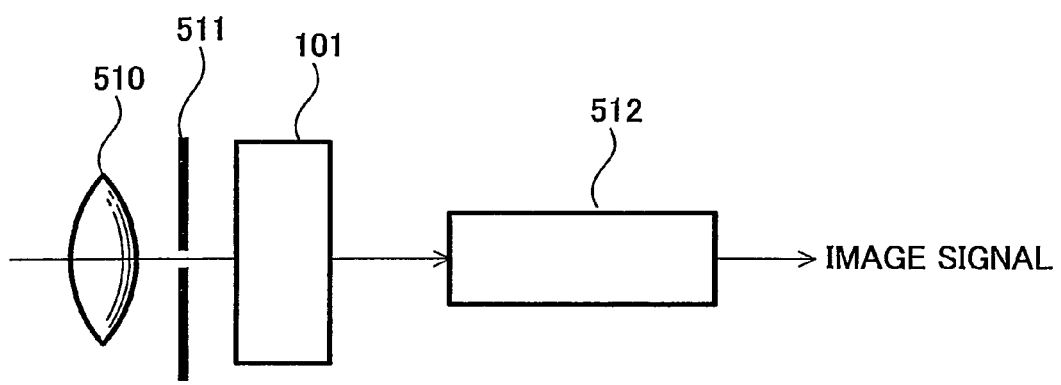
FIG. 9 is a schematic cross-sectional view of a camera according to an embodiment of the present invention.

FIG. 9 is a schematic cross-sectional view of a camera according to an embodiment of the present invention. The camera according to the embodiment is a video camera capable of capturing still images or moving images, for example.

As shown in FIG. 9, the camera according to the embodiment includes a solid-state imaging device 101 such as a CCD, a CMOS sensor or a CMD according to an embodiment of the present invention, an optical system 510, a mechanical shutter device 511, and a signal processing circuit 512.

The optical system 510 is configured to form an image of light (incident light) from an object on an imaging screen of the solid-state imaging device 101. As a result, a signal electric charge is accumulated in the solid-state imaging device 101 for a specific period.

The mechanical shutter device 511 is configured to control a light irradiation period and a light shaded period for the solid-state imaging device 101.

The signal processing circuit 512 performs various kinds of signal processing. Processed image signals are stored in a storage medium such as a memory or output to a display.

In the above-described embodiment, for example, the solid-state imaging device 101 includes unit pixels arranged in a matrix form. The unit pixels are arranged to detect a signal charge as physical value in response to an amount of visible light. However, an embodiment of the present invention is not limited to the solid-state imaging device 101. According to an embodiment of the present invention, a solid-state imaging device may be any of solid-state imaging devices including column circuits arranged for respective columns of pixels in a pixel array section.

According to an embodiment of the present invention, a solid-state imaging device may be a solid-state imaging device capturing an image by detecting distribution of an amount of incident visible light or a solid-state imaging device capturing an image by detecting distribution of an amount of incident infrared light, x-rays, particles or the like. In addition, in a broad sense, according to an embodiment of the present invention, a solid-state imaging device may be a solid-state imaging device (physical quantity distribution detector) such as a fingerprint sensor that detects distribution of a pressure, capacitance or other physical values to capture an image.

According to an embodiment of the present invention, a solid-state imaging device may be a solid-state imaging device in which each row of unit pixels is sequentially scanned in a pixel array section to read pixel signal's from the respective unit pixels or an X-Y address type solid-state imaging device in which any pixel can be selected independently to read a pixel signal from that pixel.

Further, a solid-state imaging device according to an embodiment of the present invention may be formed as one chip, or formed as an imaging function module in which an imaging part and a signal processing part are packaged or an imaging part and an optical system are packaged.

Further, according to an embodiment of the present invention, in addition to solid-state imaging devices, imaging apparatuses are provided. Such imaging apparatuses include a camera system such as a digital still camera, video camera or the like, and an electric apparatus such as a mobile phone unit having an imaging function. An imaging apparatus may be a module, that is, a camera module as described above mounted in such an electric apparatus.

The above-described solid-state imaging device 101 may be used as a solid-state imaging device in such a digital still camera, a video camera, a camera module for portable equipment such as a mobile phone unit, so that an excellent image can be obtained with a simplified configuration of the solid-state imaging device 101.

In the above-described embodiment, a CCD solid-state imaging device is described as an example of the solid-state imaging device 101 having the element isolation region 125 with the compensation region 100 provided on an edge thereof. However, the element isolation region 125 with the compensation region 100 provided on the edge thereof may also be used for a CMOS image sensor or the like. A solid-state imaging device according to an embodiment of the present invention is not limited to the aforementioned embodiments, and it should be understood that various changes and modifications are possible without departing from the scope of the present invention in terms of materials, shapes and configurations of an element isolation region and a compensation region, for example.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a narrow region of a first conductivity-type in physical contact with an insulating film, said insulating film being on a surface of a semiconductor substrate;
   a compensation region in physical contact with said narrow region, an impurity of a second conductivity-type within said compensation region being at least at said surface of the semiconductor substrate; and
   an accumulation region of the first conductivity-type between a photodiode of the second conductivity-type and said insulating film, a portion of the compensation region overlapping a portion of the accumulation region.

2. A solid-state imaging device according to claim 1, wherein said accumulation region is in physical contact with said insulating film.

3. A solid-state imaging device according to claim 1, wherein said compensation region is in physical contact with said insulating film.

4. A solid-state imaging device according to claim 1, wherein said insulating film is a light transmissive insulating film.

5. A solid-state imaging device according to claim 1, wherein said narrow region and said compensation region are in physical contact with said insulating film, said insulating film being in physical contact with said accumulation region.

6. A solid-state imaging device according to claim 1, wherein said photodiode is configured to convert light into a signal charge, an amount of the signal charge being in accordance with an amount of the light incident upon said accumulation region.

7. A solid-state imaging device according to claim 1, further comprising:
   a low impurity concentration region of the second conductivity-type between a first well region of the first conductivity-type and said insulating film, said first well region being between said low impurity concentration region and a portion of the substrate.

8. A solid-state imaging device according to claim 7, wherein said compensation region and said accumulation region are in physical contact with said photodiode, said photodiode being in physical contact with said low impurity concentration region.

9. A solid-state imaging device according to claim 7, wherein said portion of the substrate is of the second conductivity-type.

10. A solid-state imaging device according to claim 7, wherein said narrow region is between said insulating film and said low impurity concentration region.

11. A solid-state imaging device according to claim 7, wherein said narrow region is in physical contact with said low impurity concentration region.

12. A solid-state imaging device according to claim 7, wherein said first well region is in physical contact with said low impurity concentration region.

13. A solid-state imaging device according to claim 7, wherein said narrow region is in physical contact with said insulating film and said low impurity concentration region.

14. A solid-state imaging device according to claim 7, wherein an impurity concentration of the second conductivity-type in said photodiode is greater than an impurity concentration of the second conductivity-type in said low impurity concentration region.

15. A solid-state imaging device according to claim 7, further comprising:
   a charge transfer region of the second conductivity-type between a second well region of the first conductivity-type and said insulating film, said second well region being in physical contact with said charge transfer region and said low impurity concentration region.

16. A solid-state imaging device according to claim 15, wherein said insulating film is in physical contact with said charge transfer region.

17. A solid-state imaging device according to claim 15, further comprising:
   a signal charge reading region of the first conductivity-type between said insulating film and said low impurity concentration region, said signal charge reading region being in physical contact with said insulating film and said low impurity concentration region.

18. A solid-state imaging device according to claim 17, wherein a first conductivity-type impurity concentration in the accumulation region is greater than a first conductivity-type impurity concentration in the signal charge reading region.

19. A solid-state imaging device according to claim 17, wherein said first conductivity-type impurity concentration in the signal charge reading region is less than a first conductivity-type impurity concentration in the narrow region.

20. A solid-state imaging device according to claim 17, wherein said signal charge reading region is in physical contact with said accumulation region and said photodiode.

21. A solid-state imaging device according to claim 17, wherein said signal charge reading region is in physical contact with said charge transfer region and said second well region.

22. A solid-state imaging device according to claim 17, wherein said signal charge reading region is between said accumulation region and said charge transfer region.

23. A solid-state imaging device according to claim 17, wherein said signal charge reading region is between said accumulation region and said charge transfer region.

24. A solid-state imaging device according to claim 17, wherein said signal charge reading region is in physical contact with said accumulation region and said charge transfer region.

25. A solid-state imaging device according to claim 1, wherein said first conductivity-type is p-type, said first conductivity-type being of a conductivity that is opposite to said second conductivity-type.

26. A solid-state imaging device according to claim 1, wherein said second conductivity-type is n-type, said second conductivity-type being of a conductivity that is opposite to said first conductivity-type.

* * * * *